(12) United States Patent
Lee et al.

(10) Patent No.: US 12,588,272 B2
(45) Date of Patent: Mar. 24, 2026

(54) SEMICONDUCTOR DEVICE

(71) Applicant: Vanguard International Semiconductor Corporation, Hsinchu (TW)

(72) Inventors: Chia-Hao Lee, Hsinchu County (TW); Chih-Cherng Liao, Hsinchu City (TW); Po-Heng Lin, New Taipei City (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 601 days.

(21) Appl. No.: 18/078,048

(22) Filed: Dec. 8, 2022

(65) Prior Publication Data

US 2024/0194669 A1    Jun. 13, 2024

(51) Int. Cl.
| | |
|---|---|
| *H10D 84/01* | (2026.01) |
| *H01L 23/31* | (2006.01) |
| *H10D 1/43* | (2025.01) |
| *H10D 30/47* | (2025.01) |
| *H10D 62/17* | (2025.01) |
| *H10D 62/824* | (2025.01) |
| *H10D 62/85* | (2025.01) |
| *H10D 84/05* | (2025.01) |
| *H10D 84/80* | (2025.01) |

(52) U.S. Cl.
CPC ......... *H10D 84/01* (2025.01); *H01L 23/3171* (2013.01); *H10D 1/43* (2025.01); *H10D 30/475* (2025.01); *H10D 62/343* (2025.01);

*H10D 62/824* (2025.01); *H10D 62/8503* (2025.01); *H10D 84/05* (2025.01); *H10D 84/811* (2025.01)

(58) Field of Classification Search
CPC .. H10D 30/015; H10D 84/811; H10D 84/817; H10D 30/475; H10D 1/43
See application file for complete search history.

(56) References Cited

U.S. PATENT DOCUMENTS

| | | | |
|---|---|---|---|
| 8,390,091 | B2 | 3/2013 | Renaud |
| 11,195,943 | B2 | 12/2021 | Huang |

(Continued)

FOREIGN PATENT DOCUMENTS

| | | | | |
|---|---|---|---|---|
| CN | 118016706 A | * | 5/2024 | ........... H10D 30/015 |
| TW | 523790 | | 3/2003 | |

(Continued)

*Primary Examiner* — Christine S. Kim
*Assistant Examiner* — Andrew Victor Prostor
(74) *Attorney, Agent, or Firm* — Winston Hsu

(57) ABSTRACT

A semiconductor device includes a compound semiconductor channel layer disposed on a substrate and located in an active element region and a passive element region. A compound semiconductor barrier layer is stacked on the compound semiconductor channel layer and located in the active element region and the passive element region. A source electrode, a gate electrode and a drain electrode are disposed on the compound semiconductor barrier layer and located in the active element region to construct a high electron mobility transistor. In addition, a first terminal electrode, an intermediate electrode and a second terminal electrode are disposed on the compound semiconductor barrier layer and located in the passive element region to construct a resistor.

19 Claims, 10 Drawing Sheets

(56)       References Cited

U.S. PATENT DOCUMENTS

| | | |
|---|---|---|
| 2022/0123109 A1 | 4/2022 | Wong |
| 2022/0223699 A1 | 7/2022 | Brun |
| 2024/0178309 A1* | 5/2024 | Chen .................... H10D 62/343 |

FOREIGN PATENT DOCUMENTS

| | | |
|---|---|---|
| TW | 202111879 A | 3/2021 |
| TW | 202238743 A | 10/2022 |

* cited by examiner

SEMICONDUCTOR DEVICE

BACKGROUND OF THE INVENTION

1. Field of the Invention

The present disclosure relates generally to semiconductor devices, and more particularly to semiconductor devices integrating a high electron mobility transistor and a resistor on a single chip, where the resistor is a variable resistor.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2DEG) layer close to a junction between two materials with different energy gaps (i.e., a hetero-junction). The 2DEG layer is used as the transistor channel instead of a doped region, as is generally the case for metal oxide semiconductor field effect transistors (MOSFETs). Compared with MOSFETS, HEMTs have a number of attractive properties, such as high electron mobility, the ability to transmit signals at high frequencies, high breakdown voltage and low on-resistance.

In recent years, HEMTs have been used in many power supply applications due to their attractive properties. In the electronic circuits of these applications, a passive component such as a resistor is electrically connected to a HEMT. The resistor is typically a discrete component separated from the HEMT, so that the electronic circuit requires a relatively large footprint and the fabrication thereof is relatively complex.

SUMMARY OF THE INVENTION

In view of this, the present disclosure provides a semiconductor device that integrates a high electron mobility transistor (HEMT) and a resistor on a single chip. In addition, a two-dimensional electron gas (2DEG) generated by a stacked structure of a compound semiconductor channel layer and a compound semiconductor barrier layer for fabricating the HEMT is used as a resistor. The resistor is formed in a passive element region on the same chip with the HEMT. The resistor further includes an intermediate electrode. Through applying different negative biases to the intermediate electrode, the resistance of the resistor is adjusted. According to the embodiments of the present disclosure, a variable resistor is obtained without changing the structures of features of the semiconductor device, the compositions of material layers of the semiconductor device, and the size of the semiconductor device. Therefore, the requirements of different resistances of various resistors in the electronic circuit are satisfied, and the layout area of the electronic circuit is reduced.

According to an embodiment of the present disclosure, a semiconductor device is provided and includes a substrate, a compound semiconductor channel layer, a compound semiconductor barrier layer, a source electrode, a gate electrode, a drain electrode, a first terminal electrode, an intermediate electrode and a second terminal electrode. The substrate includes an active element region and a passive element region. The compound semiconductor channel layer is disposed on the substrate and located in both the active element region and the passive element region. The compound semiconductor barrier layer is stacked on the compound semiconductor channel layer and located in both the active element region and the passive element region. The source electrode, the gate electrode and the drain electrode are disposed on the compound semiconductor barrier layer and located in the active element region to construct a high electron mobility transistor. In addition, the first terminal electrode, the intermediate electrode and the second terminal electrode are disposed on the compound semiconductor barrier layer and located in the passive element region to construct a resistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
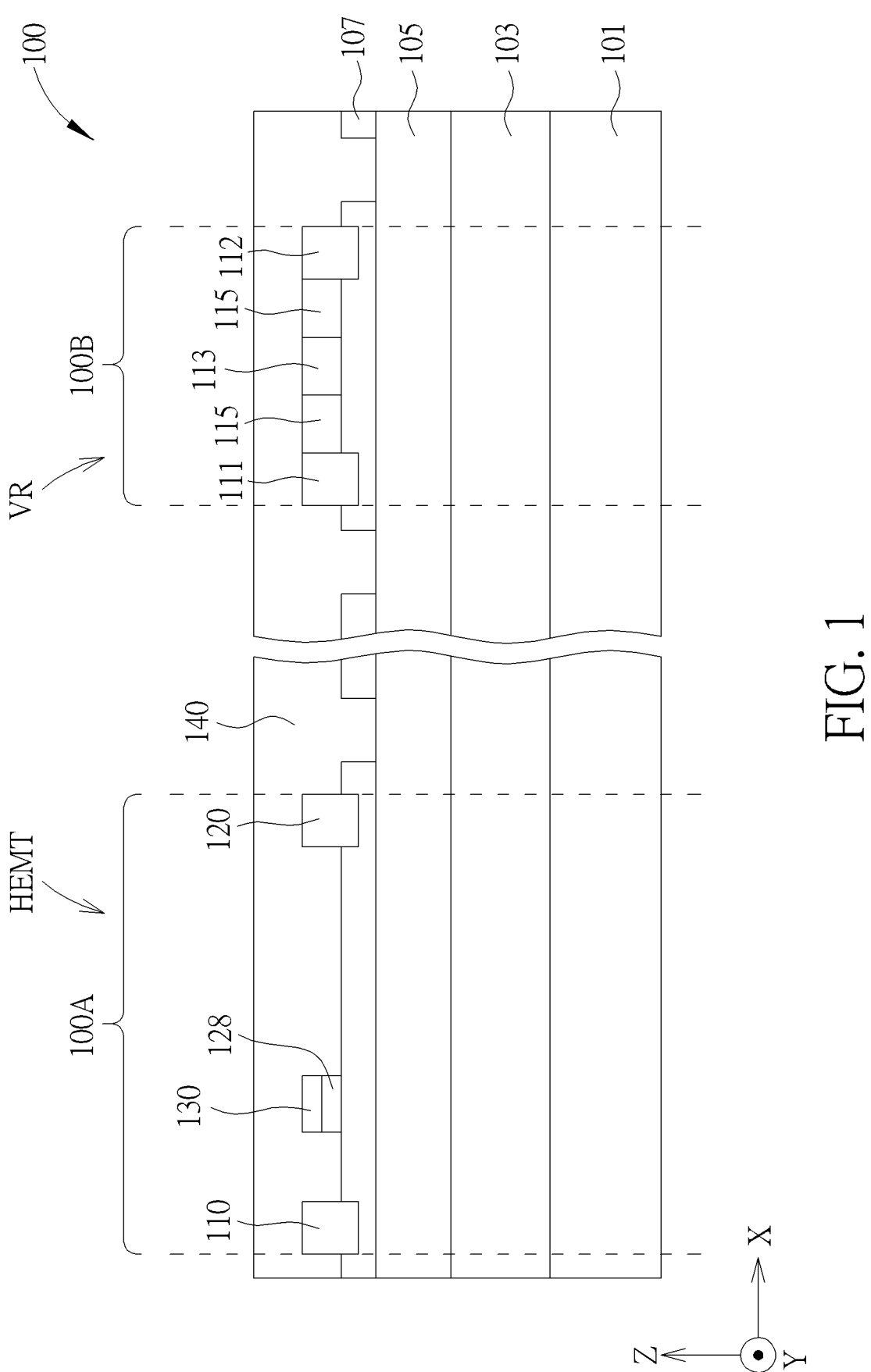
FIG. 1 is a schematic cross-sectional view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to semiconductor devices integrating a high electron mobility transistor (HEMT) and a resistor on a single chip. A two-dimensional electron gas (2DEG) generated by a stacked structure of a compound semiconductor channel layer and a compound semiconductor barrier layer for fabricating the HEMT is used as a resistor. Accordingly, the HEMT is formed in an active element region and the resistor is formed in a passive element region of the same chip at the same time. The resistor includes an intermediate electrode disposed between two terminal electrodes. Through applying different negative biases to the intermediate electrode, the resistance of the resistor is adjusted. According to the embodiments of the present disclosure, a variable resistor is obtained without changing the structures of features of the semiconductor device, the compositions of material layers of the semiconductor device, and the size of the semiconductor device. Therefore, the requirements of different resistances of various resistors in electronic circuits are satisfied, the layout area of the electronic circuits is reduced, and the manufacturing cost of the semiconductor devices is also reduced.

FIG. 1 is a schematic cross-sectional view of a semiconductor device 100 according to an embodiment of the present disclosure. The semiconductor device 100 includes a substrate 101 including an active element region 100A and a passive element region 100B. A high electron mobility transistor HEMT of the semiconductor device 100 is disposed in the active element region 100A, and a resistor VR of the semiconductor device 100 is disposed in the passive element region 100B. In some embodiments, the active element region 100A and the passive element region 100B are separated from each other by a distance. For example, the active element region 100A may be used for a high-voltage transistor, and another active element region for a low-voltage transistor may be disposed between the passive element region 100B and the active element region 100A. The high-voltage transistor, the low-voltage transistor and the resistor are all disposed on a single chip, and the semiconductor device 100 is a monolithic integration structure.

In some embodiments, the material of the substrate 101 may include ceramic, silicon carbide (Sic), aluminum nitride (AlN), sapphire, or silicon. When the substrate 101 is made of a material with high hardness, high thermal conductivity, and low electrical conductivity, such as a ceramic substrate, it is more suitable for high-voltage semiconductor devices. The aforementioned high hardness, high thermal conductivity and low electrical conductivity of the substrate 101 are compared with these of a single-crystal silicon substrate, and the high-voltage semiconductor devices refer to semiconductor devices with an operating voltage higher than 50V. In some embodiments, the substrate 101 may be a semiconductor-on-insulator (SOI) substrate. In other embodiments, the substrate 101 may be provided by a composite substrate (or referred to as a QST substrate) composed of a core substrate wrapped around by a composite material layer. The core substrate includes ceramic, silicon carbide, aluminum nitride, sapphire or silicon. The composite material layer includes an insulating material layer and a semiconductor material layer, where the insulating material layer may be a single layer or multiple layers of silicon oxide, silicon nitride or silicon oxynitride, and the semiconductor material layer may be silicon or polysilicon. In addition, during the fabrication of the semiconductor devices, the composite material layer on the backside of the core substrate is removed by a thinning process, such as a grinding or etching process, so that the backside of the core substrate is exposed.

In addition, the semiconductor device 100 includes a buffer layer 103, a compound semiconductor channel layer 105 and a compound semiconductor barrier layer 107 that are stacked on the substrate 101 from bottom to top in sequence. The buffer layer 103 reduces the degree of lattice mismatch or the stress between the substrate 101 and the compound semiconductor channel layer 105. In some embodiments, a nucleation layer may be disposed between the buffer layer 103 and the substrate 101, and a high resistance layer (or referred to as an electrical isolation layer) may be disposed between the buffer layer 103 and the compound semiconductor channel layer 105. The materials of the nucleation layer, the buffer layer 103 and the high resistance layer include group III-V semiconductors. In some embodiments, the nucleation layer is, for example, an aluminum nitride (AlN) layer. The buffer layer 103 may be a superlattice (SL) structure, for example, the buffer layer 103 may include a plurality of alternately stacked aluminum gallium nitride (AlGaN) layers and aluminum nitride (AlN) layers. The high resistance layer is, for example, a carbon-doped gallium nitride (c-GaN) layer. The aforementioned materials of the nucleation layer, the buffer layer 103 and the high resistance layer are for example, but not limited thereto. In some embodiments, the compound semiconductor channel layer 105 is, for example, an undoped gallium nitride (u-GaN) layer, and the compound semiconductor barrier layer 107 is a compound semiconductor layer with an energy gap greater than that of the compound semiconductor channel layer 105, such as an aluminum gallium nitride (AlGaN) layer, but not limited thereto. The compositions and structural configurations of the aforementioned compound semiconductor layers of the semiconductor device 100 may be determined according to the requirements of various semiconductor devices.

Still referring to FIG. 1, the semiconductor device 100 further includes a source electrode 110, a gate electrode 130 and a drain electrode 120 disposed on the compound semiconductor barrier layer 107 in the active element region 100A to construct the high electron mobility transistor HEMT. In some embodiments, the high electron mobility transistor HEMT is an enhanced mode HEMT and a compound semiconductor cap layer 128, for example a p-type gallium nitride (p-GaN) layer, is disposed between the gate electrode 130 and the compound semiconductor barrier layer 107. As shown in FIG. 1, in one embodiment, the high electron mobility transistor HEMT may be a high-voltage transistor, where the distance between the drain electrode 120 and the gate electrode 130 is greater than the distance between the source electrode 110 and the gate electrode distance between 130. In addition, there may be another active element region for a low-voltage transistor disposed between the passive element region 100B and the active element region 100A. In one embodiment, the low-voltage transistor may be enhanced mode HEMT, and a compound semiconductor cap layer is also disposed between a gate electrode of the low-voltage transistor and the compound semiconductor barrier layer 107. Moreover, in the low-voltage transistor, the distance between a drain electrode and the gate electrode is substantially equal to the distance between a source electrode and the gate electrode. In other embodiments, HEMTs in the active element region 100A and other active element regions may be depletion mode HEMTs, and gate electrodes of these depletion mode HEMTs may be directly disposed in recesses (not shown) of the compound semiconductor barrier layer 107 without the compound semiconductor cap layer 128. In some embodiments, as shown in FIG. 1, the compound semiconductor barrier layers 107 located in different active element regions and passive element regions may be several segments separated from each other. Moreover, the compound semiconductor channel layer 105 located in different active element regions and passive element regions may be a continuous material layer.

According to some embodiments of the present disclosure, the semiconductor device 100 further includes a first terminal electrode 111, an intermediate electrode 113 and a second terminal electrode 112 disposed on the compound semiconductor barrier layer 107 in the passive element region 100B to construct the resistor VR. The intermediate electrode 113 is located between the first terminal electrode 111 and the second terminal electrode 112. Moreover, the space between the first terminal electrode 111 and the intermediate electrode 113 and the space between the intermediate electrode 113 and the second terminal electrode 112 are filled with a dielectric material 115. As shown in FIG. 1, in some embodiments, the bottom surface of the first terminal electrode 111 and the bottom surface of the second terminal electrode 112 are located in the compound semiconductor barrier layer 107, and the bottom surface of the intermediate electrode 113 is in contact with the top surface of the compound semiconductor barrier layer 107. In other embodiments, the bottom surface of the first terminal electrode 111 and the bottom surface of the second terminal electrode 112 may be extended downward into the compound semiconductor channel layer 105, and the bottom surface of the intermediate electrode 113 is still in contact with the top surface of the compound semiconductor barrier layer 107. The bottom surface of the first terminal electrode 111 and the bottom surface of the second terminal electrode 112 are located in the compound semiconductor barrier layer 107 or the compound semiconductor channel layer 105, thereby facilitating a 2DEG layer generated at the heterojunction between the compound semiconductor barrier layer 107 and the compound semiconductor channel layer 105, and the 2DEG layer is used as a resistor (or referred to as a 2DEG resistor). Moreover, when a negative bias is applied to the intermediate electrode 113, the bottom surface of the intermediate electrode 113 in contact with the top surface of the compound semiconductor barrier layer 107 is beneficial to deplete 2DEG in the compound semiconductor channel layer 105 located directly below the intermediate electrode 113, thereby adjusting the resistance of the 2DEG resistor. In some embodiments, in the resistor VR, the distance between the first terminal electrode 111 and the intermediate electrode 113 may be the same as or different from the distance between the intermediate electrode 113 and the second terminal electrode 112. According to the embodiments of the present disclosure, the resistance of the resistor is mainly adjusted by the negative bias applied to the intermediate electrode 113. Accordingly, the intermediate electrode 113 may be disposed at any position between the first terminal electrode 111 and the second terminal electrode 112 without changing the resistance of the resistor VR. Therefore, the process window of fabricating the intermediate electrode 113 is enlarged, and the positional deviation of the intermediate electrode 113 may be tolerated.

In addition, in some embodiments, the first terminal electrode 111 and the second terminal electrode 112 of the resistor VR produce an ohmic contact with the compound semiconductor channel layer 105. The composition of the first terminal electrode 111 and the second terminal electrode 112 of the resistor VR may be the same as the composition of the source electrode 110 and the drain electrode 120 of the high electron mobility transistor HEMT, such as titanium (Ti), aluminum (Al), nickel (Ni), molybdenum (Mo), gold (Au) or a multilayered stacked structure of the aforementioned metal layers. Moreover, the composition of the intermediate electrode 113 of the resistor VR may be the same as the composition of the gate electrode 130 of the high electron mobility transistor HEMT, such as metal, polysilicon or silicide, where the metal is, for example, nickel (Ni), gold (Au), platinum (Pt), tungsten (W), titanium (Ti), aluminum (Al), molybdenum (Mo) or a multilayered stacked structure of the aforementioned metal layers, and the silicide is for example silicide of the aforementioned metals. In some embodiments, the first terminal electrode 111 and the second terminal electrode 112 of the resistor VR may be formed simultaneously with the source electrode 110 and the drain electrode 120 of the high electron mobility transistor HEMT. For example, by depositing and patterning the same metal layer, the first terminal electrode 111, the second terminal electrode 112, the source electrode 110 and the drain electrode 120 are formed at the same time. The intermediate electrode 113 of the resistor VR may be formed simultaneously with the gate electrode 130 of the high electron mobility transistor HEMT. For example, by depositing and patterning the same conductive material layer, the intermediate electrode 113 and the gate electrode 130 are formed at the same time. Therefore, according to the embodiments of the present disclosure, the processes of fabricating the resistor VR and the high electron mobility transistor HEMT of the semiconductor device 100 may be integrated without additional process steps. The resistor VR and the high electron mobility transistor HEMT may be simultaneously formed in the same process steps, thereby reducing the manufacturing cost of the semiconductor device.

Furthermore, the semiconductor device 100 includes a passivation layer 140 completely covering the compound semiconductor barrier layer 107 and the compound semiconductor channel layer 105. The passivation layer 140 also covers the source electrode 110, the gate electrode 130 and the drain electrode 120 of the high electron mobility transistor HEMT. The passivation layer 140 further covers the first terminal electrode 111, the intermediate electrode 113 and the second terminal electrode 112 of the resistor VR. The composition of the passivation layer 140 is different from the dielectric material 115 of the resistor VR. The composition of the passivation layer 140 is, for example, silicon nitride, and the dielectric material 115 is, for example, silicon oxide, but not limited thereto. The dielectric constant of the dielectric material 115 may be lower than the dielectric constant of the passivation layer 140.

Figure 2:
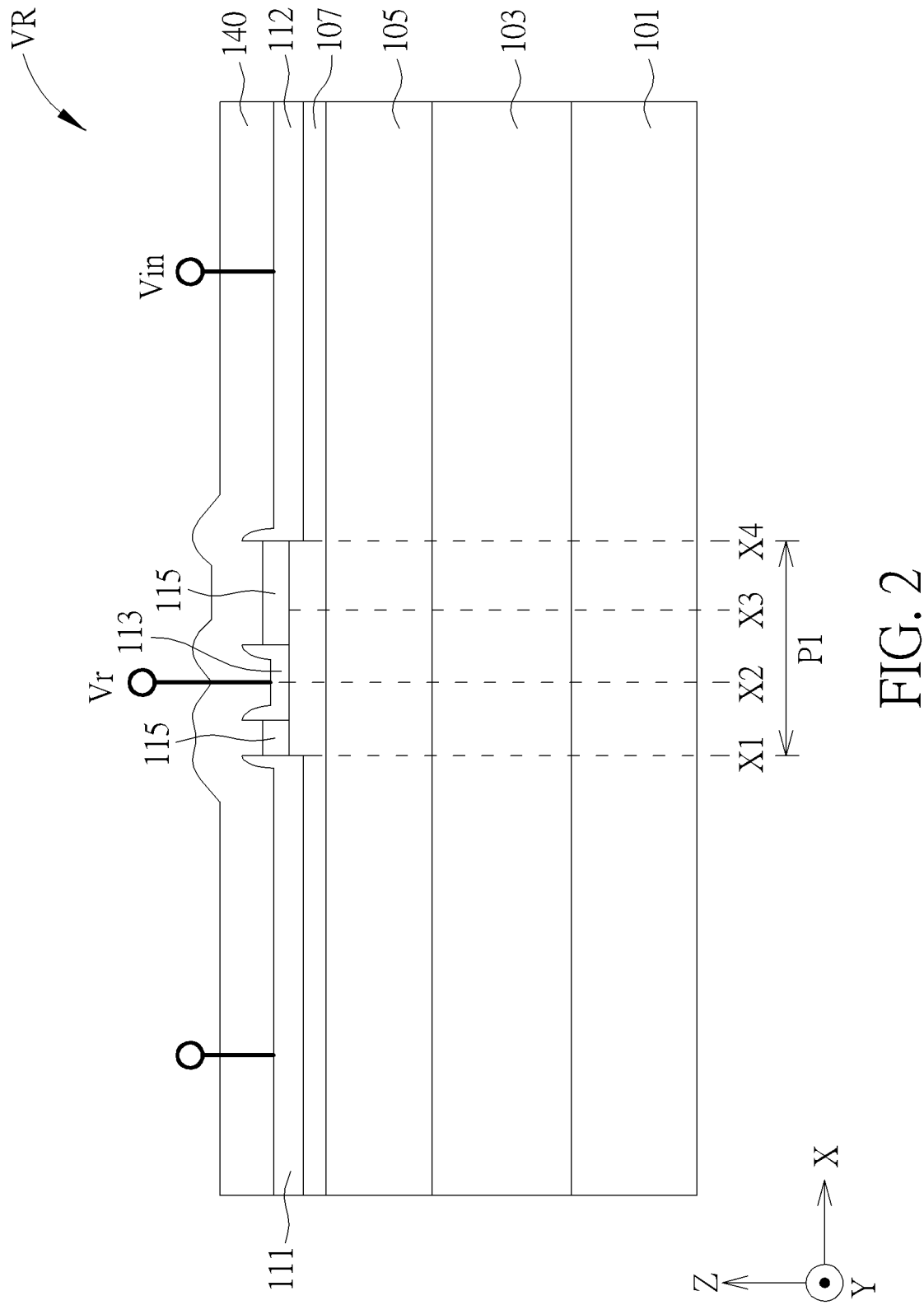
FIG. 2 is a schematic cross-sectional view of a resistor according to an embodiment of the present disclosure.

FIG. 2 is a schematic cross-sectional view of the resistor VR according to an embodiment of the present disclosure. The structure of the resistor VR in FIG. 2 is similar to the structure of the resistor VR in the passive element region 100B of the semiconductor device 100 in FIG. 1. The detailed structures of the first terminal electrode 111, the intermediate electrode 113 and the second terminal electrode 112 of the resistor VR are depicted in FIG. 2, where conductive portions at the edges of these electrodes are protruded upward, and the passivation layer 140 is conformally deposited on these electrodes to have an undulating surface profile. During the operation of the semiconductor device, a negative bias Vr is applied to the intermediate electrode 113, and an input voltage Vin is applied to the second terminal electrode 112. The amount of current flowing through the resistor VR is measured by the terminals of the first terminal electrode 111 and the second terminal electrode 112, thereby obtaining the resistance of the resistor VR. In one embodiment, referring to FIG. 1 and FIG. 2, the distance P1 between the first terminal electrode 111 and the second terminal electrode 112 of the resistor VR may be $\frac{1}{3}$ to $\frac{1}{6}$ of the distance between the source electrode 110 and the drain electrode 120 of the high electron mobility transistor HEMT.

Figure 3:
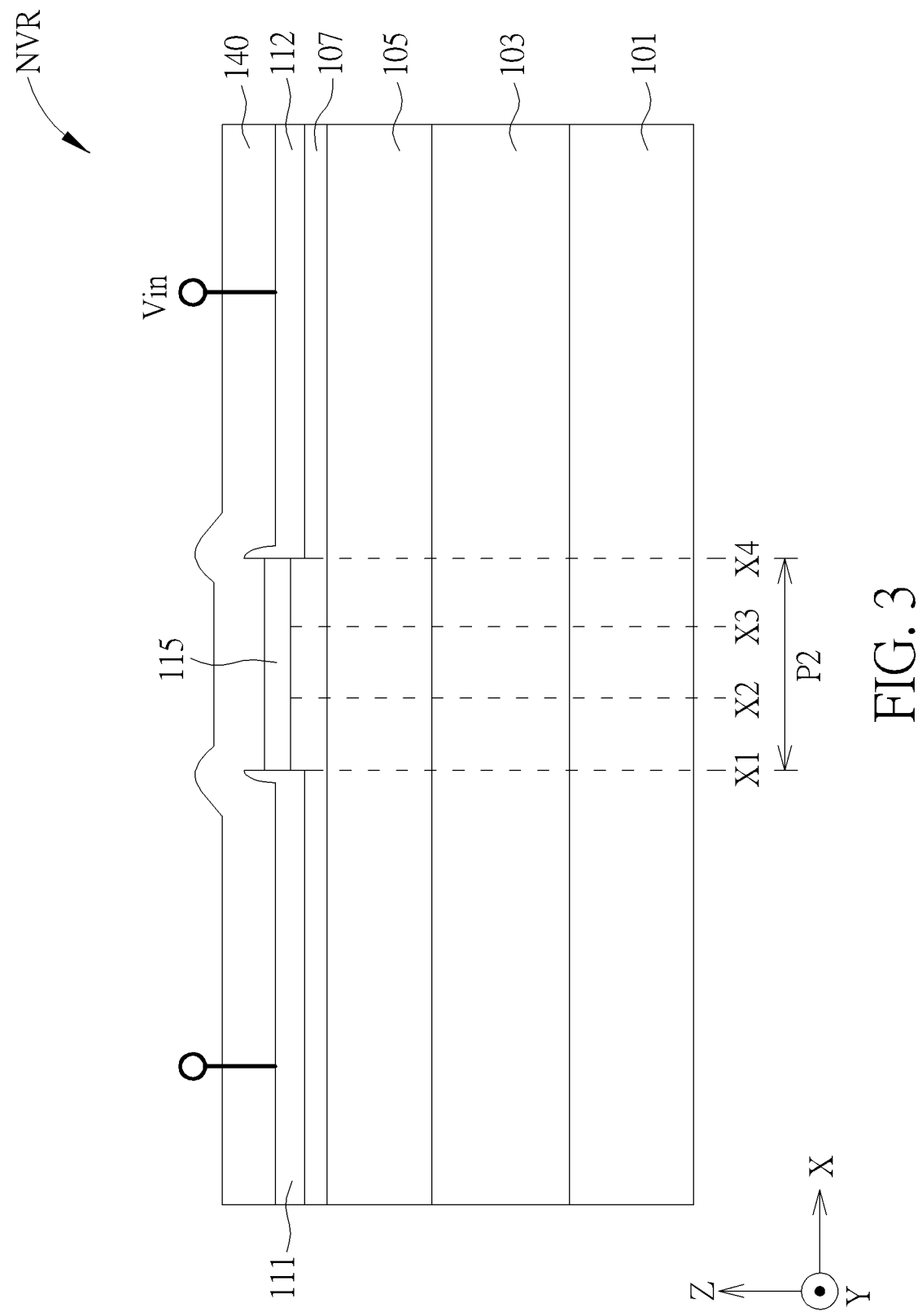
FIG. 3 is a schematic cross-sectional view of a resistor according to another embodiment of the present disclosure.

FIG. 3 is a schematic cross-sectional view of a resistor NVR according to another embodiment of the present disclosure. The difference between the resistor NVR of FIG. 3 and the resistor VR of FIG. 2 is that the resistor NVR of FIG. 3 does not have the intermediate electrode 113. The resistance of the resistor NVR cannot be adjusted by applying a negative bias. Therefore, the resistor NVR of FIG. 3 is also referred to as a non-variable resistor. The resistor VR of FIG. 2 is referred to as a variable resistor. The resistor VR of FIG. 2 and the resistor NVR of FIG. 3 both use the 2DEG generated by the stacked structure of the compound semiconductor barrier layer 107 and the compound semiconductor channel layer 105 as a resistor. Therefore, the resistor VR and the resistor NVR may be referred to as 2DEG resistors. In one embodiment, there is a distance P2 between the two terminal electrodes 111 and 112 of the resistor NVR in FIG. 3.

Through comparing the current density distributions of the resistor VR of FIG. 2 and the resistor NVR of FIG. 3, it would be known that the current density directly below the intermediate electrode 113 of the resistor VR of FIG. 2 is relatively sparse, and the current density directly below the dielectric material 115 of the resistor NVR of FIG. 3 is relatively dense. When a negative bias is applied to the intermediate electrode 113, the 2DEG directly below the intermediate electrode 113 will be depleted, thereby reducing the current density directly below the intermediate electrode 113. In addition, through comparing the potential distributions of the resistor VR of FIG. 2 and the resistor NVR of FIG. 3, it would be known that the potential on the left and right sides of the intermediate electrode 113 of the resistor VR of FIG. 2 is relatively high, and there is no higher potential at the dielectric material 115 of the resistor NVR of FIG. 3. In addition, through comparing the electric field distributions of the resistor VR of FIG. 2 and the resistor NVR of FIG. 3, it would be known that the electric field near the intermediate electrode 113 of the resistor VR of FIG. 2 is dispersed to the left and right, and the electric field of the resistor NVR of FIG. 3 is concentrated on the surface of the compound semiconductor barrier layer 107.

Figure 4:
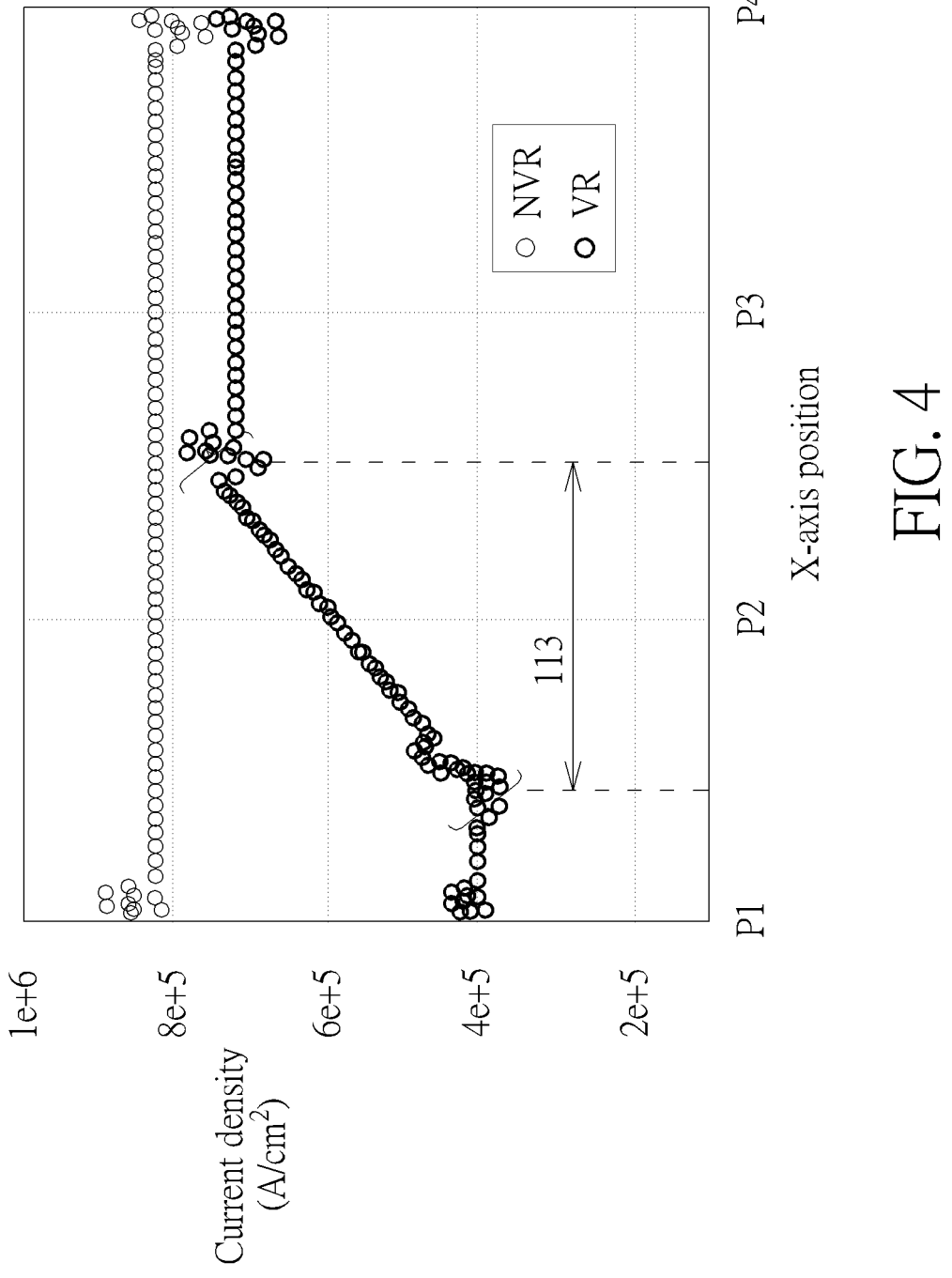
FIG. 4 is a graph showing the current density versus the X-axis position of resistors according to some embodiments of the present disclosure.

FIG. 4 is a graph showing the current density versus the X-axis position of the resistor VR of FIG. 2 and the resistor NVR of FIG. 3 according to some embodiments of the present disclosure. The horizontal axis of FIG. 4 is the X-axis position, which is referred to the X-axis positions X1, X2, X3 and X4 as shown in FIG. 2 and FIG. 3. The vertical axis of FIG. 4 is the current density with a unit of ampere/square centimeter (A/cm$^2$). The graph of FIG. 4 shows the current density in the compound semiconductor channel layer 105 of the resistor VR of FIG. 2 and the resistor NVR of FIG. 3 along the X-axis positions X1 to X4. As shown in FIG. 4, along the X-axis positions X4 to X1, the current density in the compound semiconductor channel layer 105 of the resistor NVR of FIG. 3 is not changed, and substantially maintained at about 8e+5 A/cm$^2$. In addition, along the X-axis positions X4 to X1, the current density in the compound semiconductor channel layer 105 of the resistor VR of FIG. 2 is decreased from about 7e+5 A/cm$^2$ to about 4e+5 A/cm$^2$. The current density at the X-axis position corresponding to the intermediate electrode 113 has a gradually decreasing region, which is caused by the depletion of the 2DEG in the compound semiconductor channel layer 105 while a negative bias is applied to the intermediate electrode 113. In one embodiment, the second terminal electrode 112 of the resistor VR of FIG. 2 is a voltage input terminal, a negative bias is applied to the intermediate electrode 113, and the current density in the compound semiconductor channel layer 105 directly below the intermediate electrode 113 is lower than the current density in the compound semiconductor channel layer 105 directly below the second terminal electrode 112. As shown in FIG. 4, the current density of the resistor NVR of FIG. 3 is substantially constant and is not changed with the X-axis position. The current density of the resistor VR of FIG. 2 is changed with the X-axis position, especially at the position corresponding to the intermediate electrode 113, where the current density is gradually decreased. Therefore, the resistor VR of FIG. 2 is a variable resistor through disposing the intermediate electrode 113 and applying a negative bias to the intermediate electrode 113. The resistor NVR of FIG. 3 is a non-variable resistor.

Figure 5:
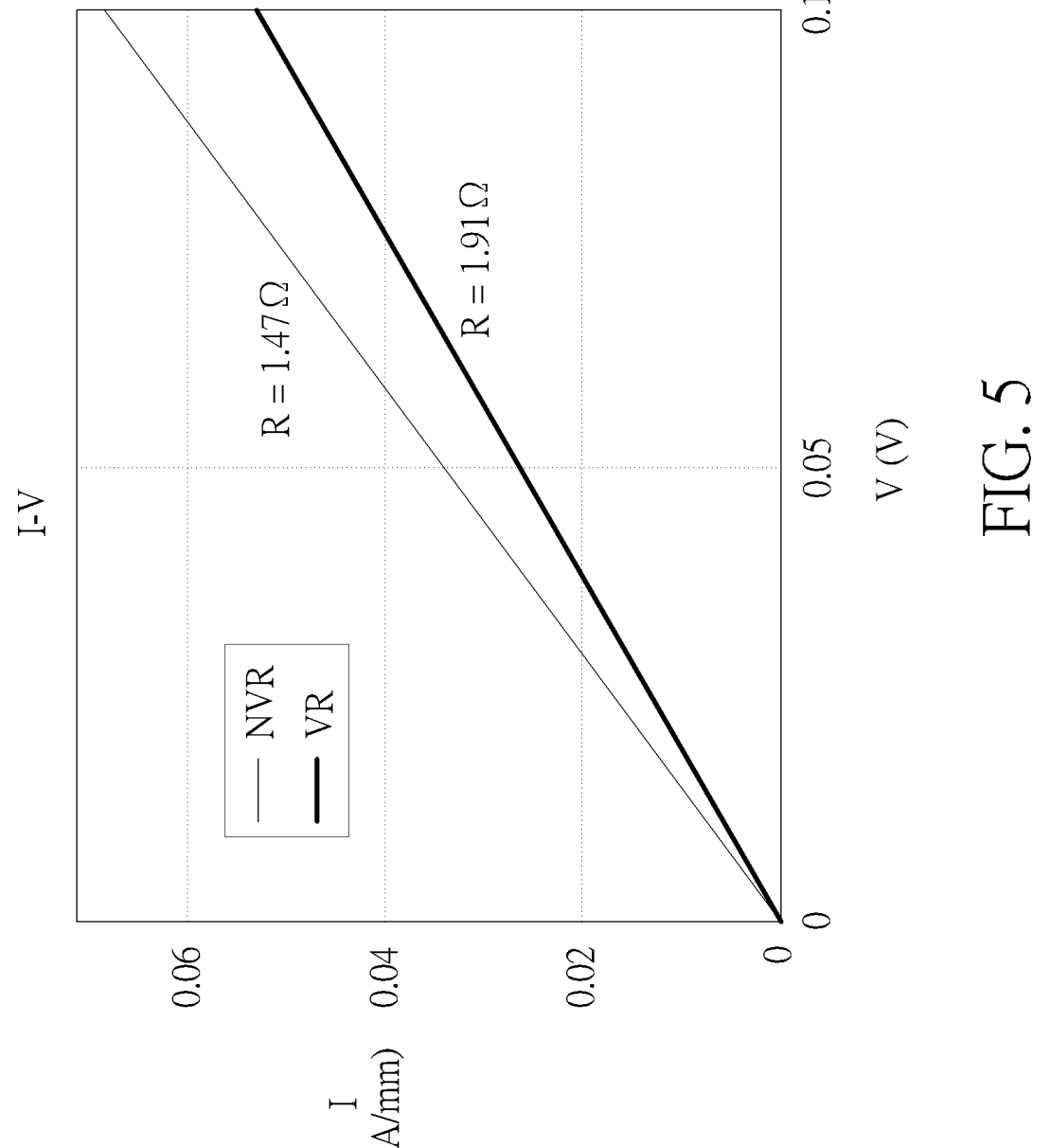
FIG. 5 is a graph showing the current versus the voltage of resistors according to some embodiments of the present disclosure.

FIG. 5 is a graph showing the current versus the voltage of the resistor VR of FIG. 2 and the resistor NVR of FIG. 3 according to some embodiments of the present disclosure. The horizontal axis of FIG. 5 is an input voltage V of the resistors with a unit of volts (V). The vertical axis of FIG. 5 is an output current I of the resistors with a unit of ampere/millimeter (A/mm). As shown in FIG. 5, through the graph of the current versus the voltage of the resistor VR, the resistance R of the resistor VR of FIG. 2 is about 1.91 ohms (Ω). As shown in FIG. 5, through the graph of the current versus the voltage of the resistor NVR, the resistance R of the resistor NVR of FIG. 3 is about 1.47 ohms (Ω). Accordingly, FIG. 5 shows that under the condition of the same input voltage V, the resistance of the resistor VR of FIG. 2 is higher than the resistance of the resistor NVR of FIG. 3.

Figure 6:
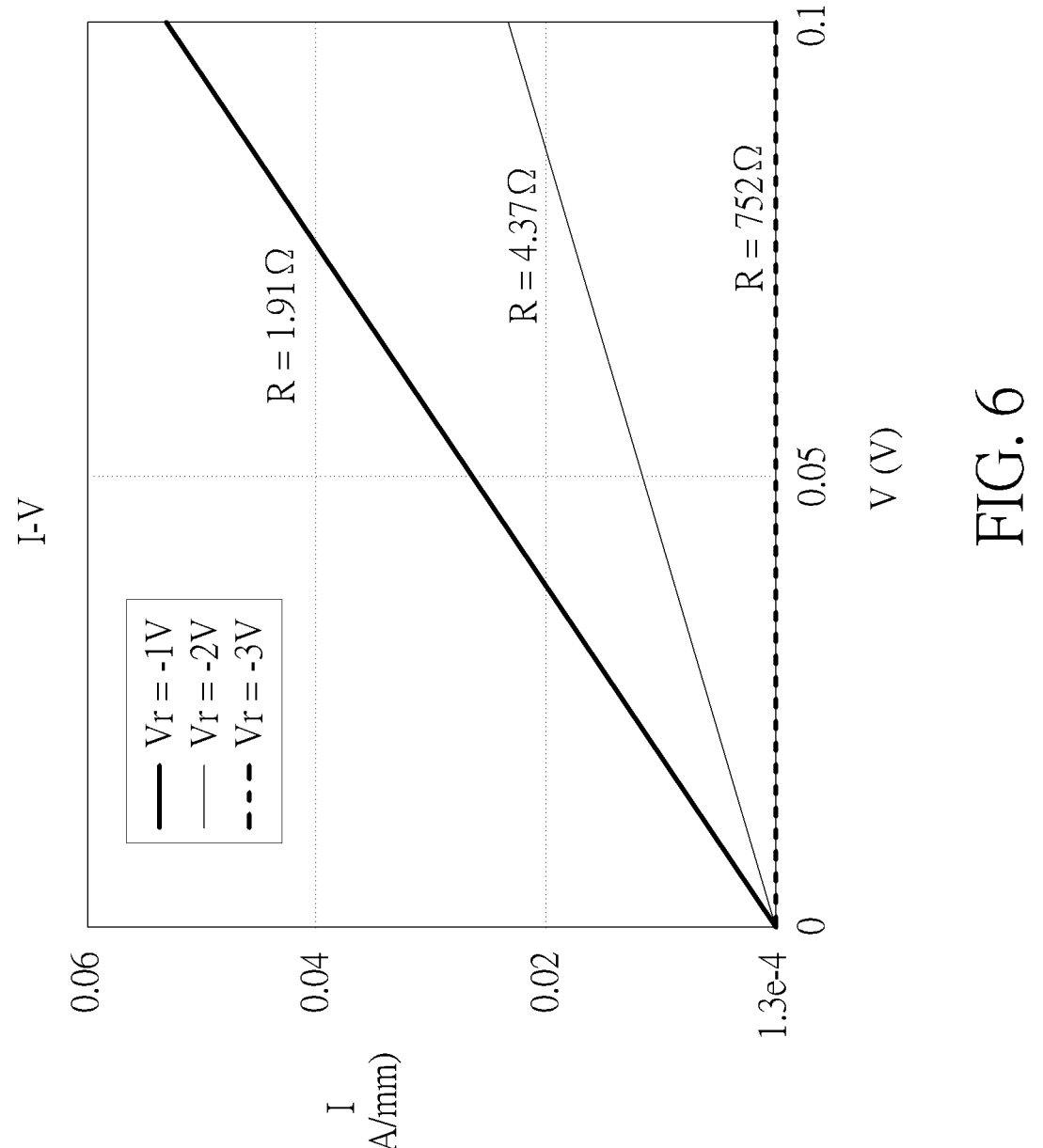
FIG. 6 is a graph showing the current versus the voltage of a resistor according to an embodiment of the present disclosure, where different negative biases are applied to the resistor.

FIG. 6 is a graph showing the current versus the voltage of the resistor VR according to an embodiment of the present disclosure, where different negative bias Vr are applied to the intermediate electrode 113 of the resistor VR of FIG. 2. The horizontal axis of FIG. 6 is an input voltage V of the resistor VR with a unit of volts (V). The vertical axis of FIG. 6 is an output current I of the resistor VR with a unit of amperes per millimeter (A/mm). As shown in FIG. 6, when the applied negative bias Vr is −1V, the resistance R of the resistor VR is about 1.91 ohms (Ω). When the applied negative bias Vr is −2V, the resistance R of the resistor VR is about 4.37 ohms (Ω). When the applied negative bias Vr is −3V, the resistance R of the resistor VR is about 725 ohms (Ω). It is known from FIG. 6, when the negative bias Vr applied to the intermediate electrode 113 of the resistor VR of FIG. 2 is greater, the obtained resistance R is higher. Accordingly, the resistance of the resistor VR is adjusted by adjusting the negative bias applied to the intermediate electrode 113 of the resistor VR.

Figure 7:
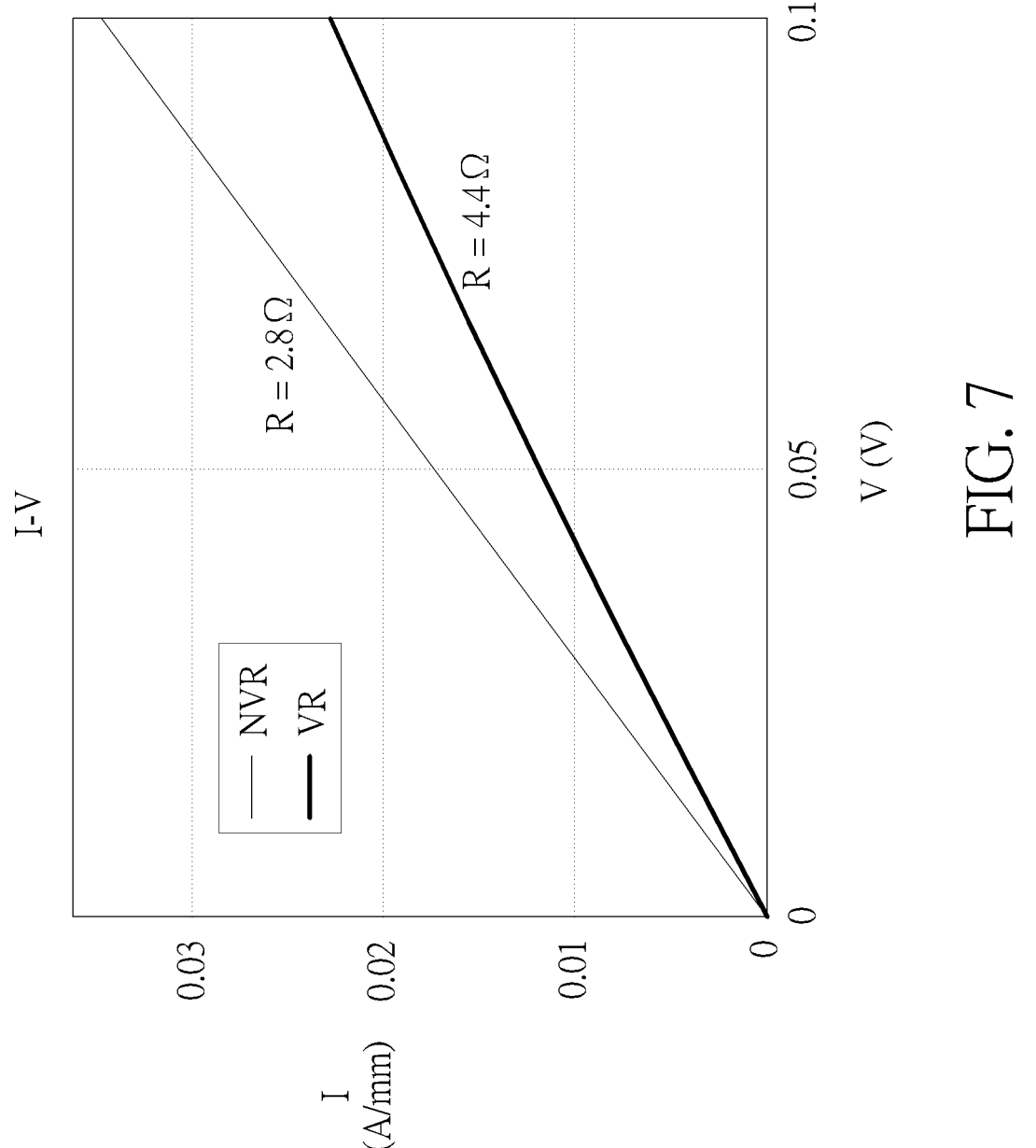
FIG. 7 is a graph showing the current versus the voltage of resistors according to some embodiments of the present disclosure.

FIG. 7 is a graph showing the current versus the voltage of the resistor VR of FIG. 2 and the resistor NVR of FIG. 3 according to some embodiments of the present disclosure. The horizontal axis of FIG. 7 is an input voltage V of the resistors with a unit of volts (V). The vertical axis of FIG. 7 is an output current I of the resistors with a unit of ampere/millimeter (A/mm). The distance P1 between the two terminal electrodes of the resistor VR is 3 micrometers (μm). The distance P2 between the two terminal electrodes of the resistor NVR is 6 micrometers (μm). As shown in FIG. 7, the resistance R of the resistor VR of FIG. 2 is about 4.4 ohms (Ω), and the resistance R of the resistor NVR of FIG. 3 is about 2.8 ohms (Ω). It is known from FIG. 7, even though the distance P2 of the resistor NVR of FIG. 3 is twice the distance P1 of the resistor VR of FIG. 2, the resistance of the resistor NVR of FIG. 3 is still lower than the resistance of the resistor VR of FIG. 2.

Figure 8:
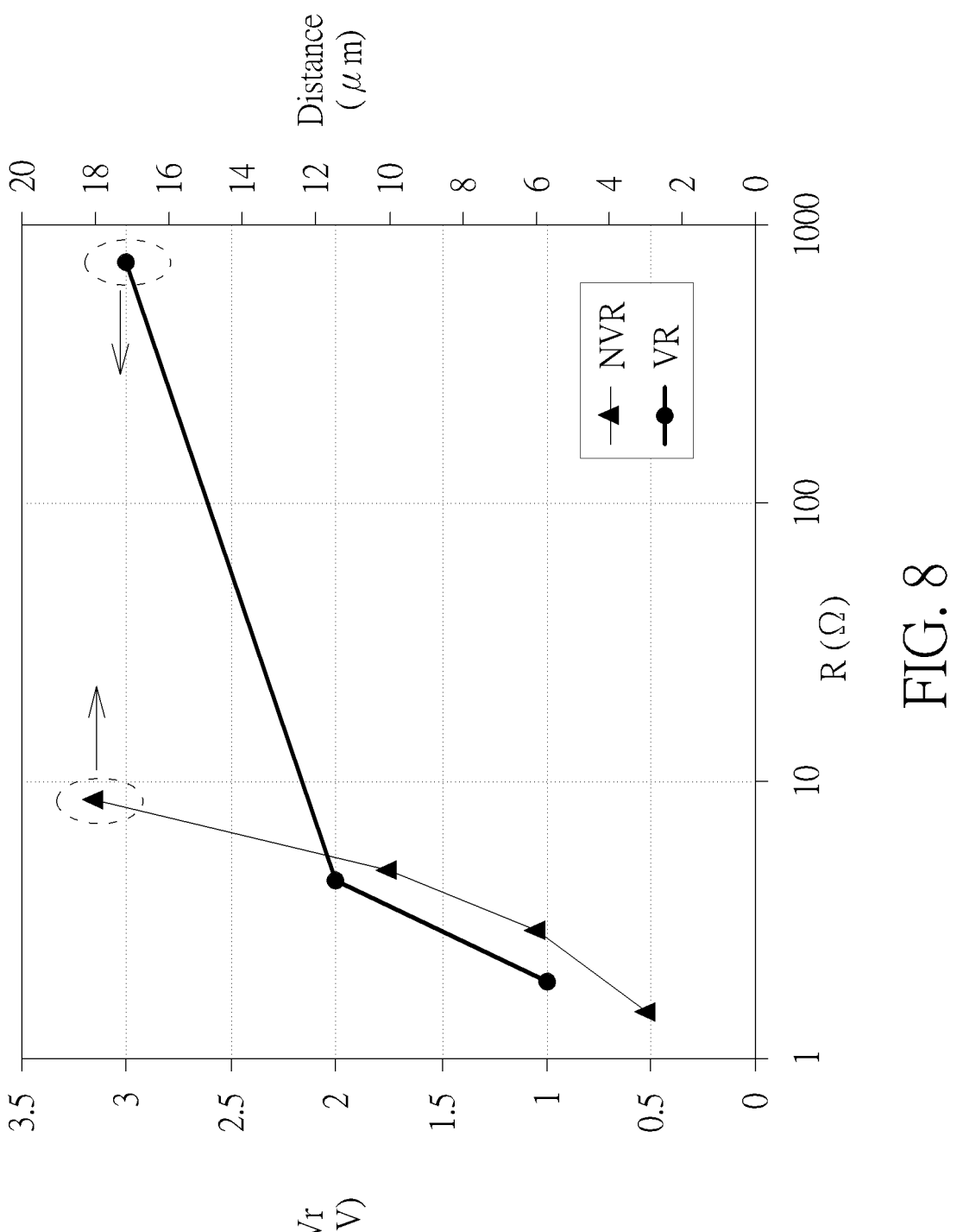
FIG. 8 is a graph showing the applied negative bias versus the resistance of resistors according to some embodiments of the present disclosure, and showing the distance between two terminal electrodes versus the resistance of resistors according to other embodiments of the present disclosure.

FIG. 8 is a graph showing the different negative biases applied to the intermediate electrode 113 of the resistor VR of FIG. 2 versus the resistance of the resistor VR according to some embodiments of the present disclosure, and showing the different distances P2 between two terminal electrodes of the resistor NVR of FIG. 3 versus the resistance of the resistor NVR according to other embodiments of the present disclosure. The horizontal axis of FIG. 8 is the resistance R with a unit of ohm (Ω). One vertical axis of FIG. 8 corresponding to the resistor VR is the negative bias Vr with a unit of volts (V). Another vertical axis of FIG. 8 corresponding to the resistor NVR is the distance P2 with a unit of micrometers (μm), where the distance P2 is between the two terminal electrodes of the resistor NVR. As shown in FIG. 8, the resistance R of the resistor VR is higher while the applied negative bias Vr is increased, where the resistance R and the negative bias Vr have a nonlinear relationship. As shown in FIG. 8, the resistance R of the resistor NVR is higher while the distance P2 between the two terminal electrodes is larger, where the resistance R and the distance P2 have a substantially linear relationship.

It is known from FIG. 8, when the negative bias Vr applied to the resistor VR is adjusted to more than about −3V, the resistance of the resistor VR is about 1000 ohms (Ω). When the distance P2 of the resistor NVR is adjusted to more than about 18 micrometers (μm), the resistance of the resistor NVR is only about 10 ohms (Ω). It would be known that the resistance of the resistor VR of FIG. 2 may reach about 1000 ohms (Ω) through disposing the intermediate electrode 113 and applying a higher negative bias Vr of about −3.5V to the intermediate electrode 113. However, the resistance of the resistor NVR of FIG. 3 is only increased to about 10 ohms (Ω) even if the distance P2 between the two terminal electrodes of the resistor NVR is increased to about 20 μm. Therefore, according to the embodiments of the present disclosure, the distance P1 between the two terminal electrodes of the resistor VR may be maintained at about 6 micrometers (μm) without increasing the size of the resistor VR (for example, the distance P1 between the two terminal electrodes), the resistance of the resistor VR is adjusted by adjusting the negative bias applied to the intermediate electrode 113, such that the resistor VR has different resistances. When the negative bias is higher, the resistance of the resistor VR is higher. The resistance of the resistor VR is greatly increased while the negative bias is increased by 1V, which is beneficial to satisfy the requirements of different resistances of various resistors in an electronic circuit. Moreover, the resistance of the resistor VR is increased without enlarging the size of the semiconductor device, which is beneficial to the size reduction of the semiconductor device. In some embodiments, when the negative bias is from −0.5 volts (V) to −3.5 volts (V), the resistance of the resistor VR is from 1 ohm (Ω) to 1000 ohms (Ω). In other embodiments, when the negative bias is from −1 volt (V) to −3 volts (V), the resistance of the resistor VR is from 1.91 ohms (Ω) to 725 ohms (Ω).

Figure 9:
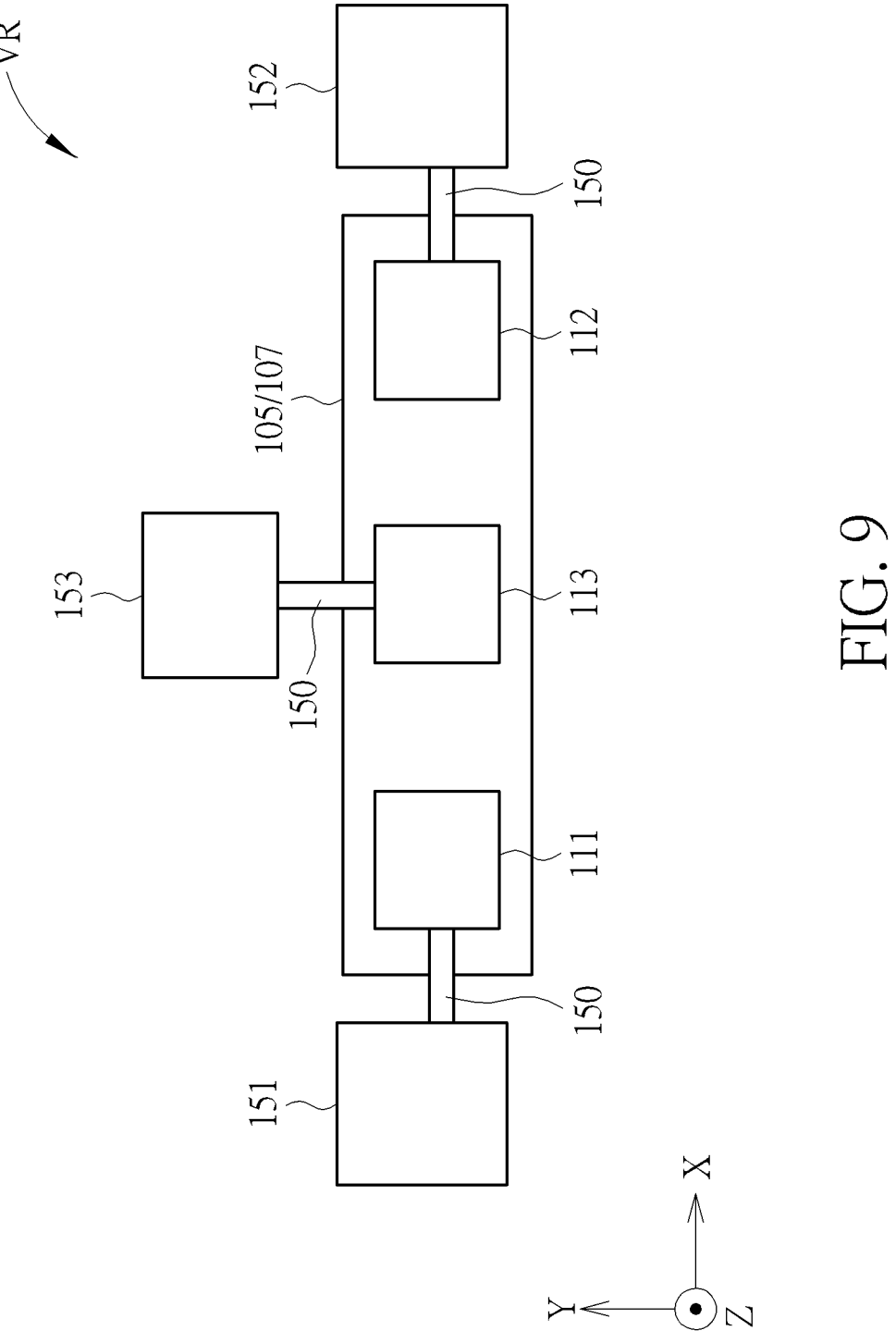
FIG. 9 is a schematic top view of a resistor according to an embodiment of the present disclosure.

FIG. 9 is a schematic top view of the resistor VR according to an embodiment of the present disclosure. The resistor VR includes the first terminal electrode 111, the intermediate electrode 113 and the second terminal electrode 112, which are disposed on the stacked structure of the compound semiconductor channel layer 105 and the compound semiconductor barrier layer 107. The first terminal electrode 111, the intermediate electrode 113 and the second terminal electrode 112 may be electrically connected to contact pads 151, 153 and 152, respectively, through wires 150 in the same layer. The top-view shapes of the first terminal electrode 111, the intermediate electrode 113, the second terminal electrode 112, and the contact pads 151, 153 and 152 as shown in FIG. 9 are all rectangles, but not limited thereto. These electrodes and contact pads may be other geometric shapes, such as circles, polygons, or other shapes. In some embodiments, the contact pad 151 electrically connected to the first terminal electrode 111 may be formed simultaneously with the contact pad of the source electrode 110 of the high electron mobility transistor HEMT in FIG. 1 in the same process step. The contact pad 152 electrically connected to the second terminal electrode 112 may be formed simultaneously with the contact pad of the drain electrode 120 of the high electron mobility transistor HEMT in the same process step. The contact pad 153 electrically connected to the intermediate electrode 113 may be formed simultaneously with the contact pad of the gate electrode 130 of the high electron mobility transistor HEMT in the same process step. Therefore, according to the embodiments of the present disclosure, the processes of fabricating the resistor and the high electron mobility transistor may be integrated to simplify the process steps and reduce the manufacturing cost of the semiconductor devices.

Figure 10:
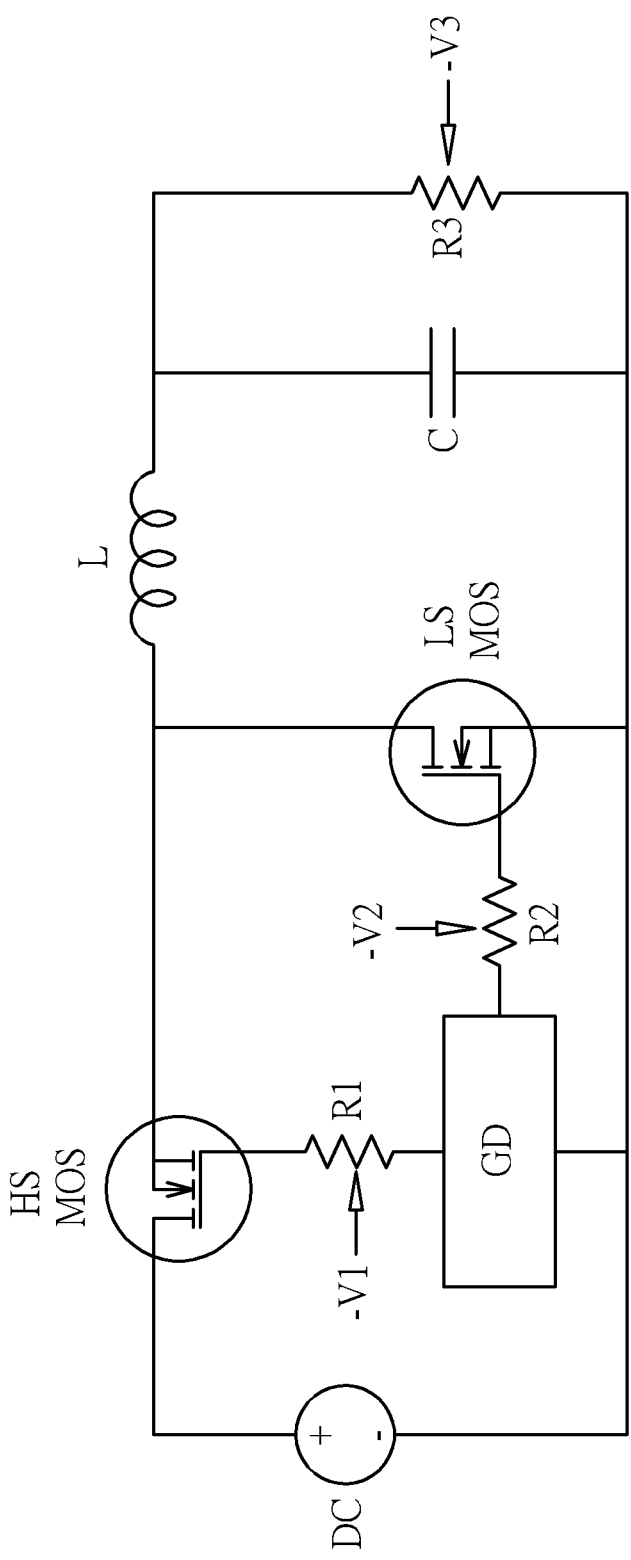
FIG. 10 is a circuit diagram of applying a semiconductor device according to an embodiment of the present disclosure.

FIG. 10 is a circuit diagram of applying the semiconductor device 100 according to an embodiment of the present disclosure, where the circuit diagram is a buck converter. In one embodiment, the high electron mobility transistor HEMT of the semiconductor device 100 of FIG. 1 may be used as a high-voltage side transistor HS MOS in the circuit diagram of FIG. 10. The resistor VR of the semiconductor device 100 may be used as various resistors R1, R2 and R3 in the circuit diagram of FIG. 10. A low-voltage side transistor LS MOS in the circuit diagram may have a structure similar to that of the high electron mobility transistor HEMT of the semiconductor device 100, but the distance between the drain electrode and the gate electrode of the low-voltage side transistor LS MOS is smaller than the distance between the drain electrode and the gate electrode of the high-voltage side transistor HS MOS. According to some embodiments of the present disclosure, various negative biases −V1, −V2 and −V3 may be applied to the intermediate electrodes of the resistors R1, R2 and R3, respectively. These negative biases −V1, −V2 and −V3 may be adjusted according to the requirement of the circuit, so that each of the resistors R1, R2 and R3 has the desired resistance. As shown in FIG. 10, a direct current power supply DC outputs a voltage to the drain of the high-voltage side transistor HS MOS. The source of the high-voltage side transistor HS MOS is electrically connected to the drain of the low-voltage side transistor LS MOS. One terminal (for example, the first terminal electrode) of the resistor R1 is electrically connected to a gate driver GD. Another terminal (for example, the second terminal electrode) of the resistor R1 is electrically connected to the gate of the high-voltage side transistor HS MOS. One terminal (for example, the first terminal electrode) of the resistor R2 is electrically connected to the gate driver GD. Another terminal (for example, the second terminal electrode) of the resistor R2 is electrically connected to the gate of the low-voltage side transistor LS MOS. The gate driver GD may be used as a power amplifier for amplifying and transmitting electrical signals to the resistors R1 and R2 to control the high-voltage side transistor HS MOS and the low-voltage side transistor LS MOS, respectively. In addition, the circuit diagram of the buck converter further includes an inductor L, a capacitor C and another resistor R3 electrically coupled to the low-voltage side transistor LS MOS and the high-voltage side transistor HS MOS. The inductor L and the capacitor C may be used as an energy storage component. The resistor R3 may adjust an output voltage. The buck converter may make the output voltage lower than the input voltage, but the output current will be greater than the input current.

The semiconductor devices of the embodiments of the present disclosure integrate a high electron mobility transistor (HEMT) and a resistor on a single chip. The 2DEG generated by the stacked structure of the compound semiconductor channel layer and the compound semiconductor barrier layer for fabricating the HEMT is used as a resistor. Accordingly, the HEMT and the resistor are formed on the same chip to reduce the layout area of an electronic circuit. In addition, the resistors of the embodiments of the present disclosure include an intermediate electrode disposed between two terminal electrodes. The resistance of the resistor is adjusted by applying different negative biases to the intermediate electrode. Therefore, according to the embodiments of the present disclosure, the resistor is a variable resistor without changing the structures of the features of the semiconductor device, the compositions of the material layers of the semiconductor device, and the size of the semiconductor device. The resistors of the embodiments of the present disclosure satisfy the requirements of different resistances of various resistors in the electronic circuits. According to the embodiments of the present disclosure, a resistor with a high resistance is obtained by increasing the negative bias applied to the intermediate electrode without increasing the size of the resistor, thereby reducing the manufacturing cost of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, comprising an active element region and a passive element region;
a compound semiconductor channel layer, disposed on the substrate and located in the active element region and the passive element region;
a compound semiconductor barrier layer, stacked on the compound semiconductor channel layer and located in the active element region and the passive element region;

a source electrode, a gate electrode and a drain electrode, disposed on the compound semiconductor barrier layer and located in the active element region to construct a high electron mobility transistor; and a first terminal electrode, an intermediate electrode and a second terminal electrode, disposed on the compound semiconductor barrier layer and located in the passive element region to construct a resistor, wherein the second terminal electrode of the resistor is electrically coupled to the gate electrode of the high electron mobility transistor, and the first terminal electrode of the resistor is electrically coupled to a gate driver.

2. The semiconductor device of claim 1, wherein a negative bias is applied to the intermediate electrode, and different resistances of the resistor are produced by different magnitudes of the negative bias.

3. The semiconductor device of claim 1, wherein a negative bias is applied to the intermediate electrode, and a resistance of the resistor increases with a magnitude of the negative bias.

4. The semiconductor device of claim 1, wherein a negative bias is applied to the intermediate electrode, and the resistor is configured so that when a magnitude of the negative bias is from −0.5 volts to −3.5 volts, the resistance of the resistor is from 1 ohm to 1000 ohms.

5. The semiconductor device of claim 1, wherein a negative bias is applied to the intermediate electrode, and the resistor is configured so that when a magnitude of the negative bias is from −1.0 volt to −3.0 volts, the resistance of the resistor is from 1.91 ohms to 725 ohms.

6. The semiconductor device of claim 1, wherein a distance between the first terminal electrode and the second terminal electrode of the resistor is from ⅓ to ⅙ of a distance between the source electrode and the drain electrode of the high electron mobility transistor.

7. The semiconductor device of claim 1, wherein a bottom surface of the first terminal electrode and a bottom surface of the second terminal electrode of the resistor are located in the compound semiconductor barrier layer, and a bottom surface of the intermediate electrode is in contact with a top surface of the compound semiconductor barrier layer.

8. The semiconductor device of claim 1, wherein a composition of the intermediate electrode of the resistor is the same as a composition of the gate electrode of the high electron mobility transistor.

9. The semiconductor device of claim 1, wherein a composition of the intermediate electrode of the resistor comprises metal, polysilicon or silicide.

10. The semiconductor device of claim 1, wherein a composition of the first terminal electrode and the second terminal electrode of the resistor is the same as a composition of the source electrode and the drain electrode of the high electron mobility transistor.

11. The semiconductor device of claim 1, wherein a distance between the first terminal electrode and the intermediate electrode is the same as a distance between the intermediate electrode and the second terminal electrode or different from a distance between the intermediate electrode and the second terminal electrode.

12. The semiconductor device of claim 1, wherein a space between the first terminal electrode and the intermediate electrode and a space between the intermediate electrode and the second terminal electrode are filled with a dielectric material.

13. The semiconductor device of claim 12, further comprising a passivation layer covering the first terminal electrode, the intermediate electrode and the second terminal electrode, and a composition of the passivation layer is different from the dielectric material.

14. The semiconductor device of claim 1, wherein the high electron mobility transistor comprises a high-voltage side transistor or a low-voltage side transistor.

15. The semiconductor device of claim 1, wherein a composition of the compound semiconductor channel layer comprises gallium nitride (GaN), and a composition of the compound semiconductor barrier layer comprises aluminum gallium nitride (AlGaN).

16. The semiconductor device of claim 1, wherein the second terminal electrode of the resistor is a voltage input terminal, and a current density of the compound semiconductor channel layer directly below the intermediate electrode is lower than a current density of the compound semiconductor channel layer directly below the second terminal electrode.

17. The semiconductor device of claim 1, wherein the resistor is a two-dimensional electron gas (2DEG) variable resistor, and the high electron mobility transistor and the resistor are disposed on a single chip.

18. The semiconductor device of claim 1, wherein the first terminal electrode and the second terminal electrode of the resistor produce an ohmic contact with the compound semiconductor channel layer.

19. The semiconductor device of claim 1, wherein the first terminal electrode, the intermediate electrode and the second terminal electrode are disposed directly on the compound semiconductor barrier layer.

* * * * *